United States Patent
Face, Jr.

(10) Patent No.: US 6,213,564 B1
(45) Date of Patent: Apr. 10, 2001

(54) ANTI-LOCK BRAKE SYSTEM WITH PIEZOELECTRIC BRAKE ACTUATOR

(75) Inventor: Samuel Allen Face, Jr., Norfolk, VA (US)

(73) Assignee: Face International Corp, Norfolk, VA (US)

(*) Notice: Subject to any disclaimer, the term of this patent is extended or adjusted under 35 U.S.C. 154(b) by 0 days.

(21) Appl. No.: 09/272,908

(22) Filed: Mar. 19, 1999

Related U.S. Application Data

(63) Continuation-in-part of application No. 08/834,233, filed on Apr. 15, 1997, now abandoned.

(51) Int. Cl.$^7$ .............. H01L 41/08; B60T 13/00
(52) U.S. Cl. .............. 303/3; 310/328; 303/20; 303/155; 303/113.1; 303/115.1; 188/370; 188/72.1; 188/158
(58) Field of Search .............. 303/3, 113.1, 191, 303/115.1, 20, 155, 186–189, 115.4, 115.2, 121; 188/370, 161, 158, 156, 72.1, 72.4, 72.8, 72.3; 192/107 C, 107 R, 110 R, 84.1; 60/545; 310/328, 311, 316.01, 324; 318/14, 563, 646, 362, 118; 340/338; 701/70

(56) References Cited

U.S. PATENT DOCUMENTS

| | | | |
|---|---|---|---|
| 4,327,414 | * | 4/1982 | Klerh . |
| 4,623,044 | * | 11/1986 | Ohta et al. .......... 188/158 |
| 4,629,039 | * | 12/1986 | Imoto et al. .......... 188/72.1 |
| 4,705,323 | * | 11/1987 | Imoto et al. . |
| 4,802,562 | * | 2/1989 | Kuroyanagi et al. . |
| 4,854,424 | * | 8/1989 | Yamatoh et al. .......... 188/158 |
| 4,934,761 | * | 6/1990 | Sauvageot et al. . |
| 5,067,778 | * | 11/1991 | Testardi .......... 303/20 |
| 5,090,518 | * | 2/1992 | Schenk et al. .......... 303/20 |
| 5,125,483 | * | 6/1992 | Kitagawa et al. .......... 188/158 |
| 5,377,802 | * | 1/1995 | Ida . |
| 5,471,721 | * | 12/1995 | Haertling . |
| 5,632,841 | * | 5/1997 | Hellbaum et al. . |
| 5,645,143 | * | 7/1997 | Mohr et al. .......... 188/72.1 |
| 5,810,454 | * | 9/1998 | Prinzler et al. .......... 303/20 |
| 5,826,683 | * | 10/1998 | Murata et al. .......... 188/72.1 |
| 5,829,845 | * | 11/1998 | Maron et al. .......... 303/20 |
| 5,831,371 | * | 11/1998 | Bishop .......... 310/328 |
| 5,849,154 | * | 12/1998 | Clark . |
| 6,030,480 | * | 2/2000 | Face, Jr. et al. . |
| 6,060,811 | * | 5/2000 | Fox et al. .......... 310/328 |

* cited by examiner

Primary Examiner—Douglas C. Butler
(74) Attorney, Agent, or Firm—Stephen E. Clark; David J. Bolduc

(57) ABSTRACT

An anti-lock braking system includes a moveable member to be braked and a friction brake for applying a braking force. A controller actuates the friction brake in accordance with braking force demands. Braking force demands are determined by the controller by electrical input signals received from a signal generator that is mechanically linked to the brake pedal, as well as by signals from a slip sensor. The slip sensor records values from wheel speed sensor and computes values that may indicate a slippage condition. Based on the recorded and computed values, the slip sensor and sends electric signals to the controller. The friction brake includes a prestressed piezoelectric element that is lightweight, less cumbersome, and highly controllable as compared with prior anti-lock braking devices, and is actuated via electrical signals rather than a mechanical system. A modification is disclosed in which an anti-lock system is placed on each wheel with independent slip sensors providing signals to controllers that control application of braking forces over each wheel as necessary.

7 Claims, 4 Drawing Sheets

ANTI-LOCK BRAKE SYSTEM WITH PIEZOELECTRIC BRAKE ACTUATOR

This application is a Continuation-in-Part of application Ser. No. 08/834,233 filed Apr. 15, 1997, now abandoned.

BACKGROUND OF THE INVENTION

1. Field of Invention

The present invention relates to anti-lock brake systems. More particularly, the present invention relates to brake systems (principally anti-locking automotive brake systems) in which a braking force is applied by an electrically actuated piezoelectric element.

2. Description of the Prior Art

Prior automobile braking systems typically comprise a foot pedal to which the driver applies a force, means for multiplying the foot pedal force, and means for transmitting this force to one or more stationary brake pads which press (either directly or indirectly) against the rotating wheel(s). When the brake friction pads press against the turning wheels (or, more specifically, against the brake drums or brake discs associated with the wheels), the rotation of the wheels slows down due to the friction between the brake friction pads and the wheels. The amount of braking friction at each wheel is typically proportional to the force each brake friction pad applies to the respective wheels.

In the prior art, transmission of the (multiplied) foot pedal forces to the brake pads is typically accomplished by mechanical means. Such prior systems include hydraulic, pneumatic, lever-action, and other power transmission systems, as well as combinations of such mechanisms.

A problem with prior mechanical foot pedal-to-brake pad force transmission systems is that they are subject to wearing out (particularly at linkage connections, at seals, and at other areas where parts move against each other). Another problem with prior mechanical foot pedal-to-brake pad force transmission systems comprising hydraulic or pneumatic lines, is that they are susceptible to failure by leaking hydraulic fluid or air. Another problem with prior mechanical foot pedal-to-brake pad force transmission systems comprising hydraulic or pneumatic lines is that they are relatively expensive, heavy, cumbersome, and take up a lot of space.

When an automobile driver applies pressure to the brake pedal in a vehicle initially moving at a uniform rate of speed, the wheels tend to slow down relative to the ground. As the brake pressure applied is increased, the braking forces on the vehicle increase in response to the driver's commands. The braking forces on the vehicle will continue to increase with increased brake pedal pressure until the maximum braking capability of the particular tire and road surface is reached. Upon further application of the brake input, the rotational speed of a wheel becomes lower than the vehicle speed, and "slippage" occurs between the tire and the driving surface. This slippage, when severe, can lead to lock-up of a wheel and skidding of the vehicle. When wheel slip occurs between the wheel and the road surface, the ability of the vehicle to follow driver's commands is reduced, and the braking distance is considerably increased.

Anti-lock Braking Systems have been proposed to minimize or eliminate slippage between the wheel and the road surface. Anti-lock Braking Systems (ABS) are feedback control systems that attempt to maintain controlled braking under all operating conditions. This is typically accomplished by prior braking systems by controlling the slip at each wheel so as to obtain optimum braking forces within the limits of the tire-road combination.

Although various ABS schemes have been proposed in the prior art, virtually all prior ABS designs use the same fundamental elements, namely: a foot pedal which is operated by the vehicle's driver; a booster/master cylinder/modulator which increases the braking force deliverable to the wheels; mechanical (hydraulic or pneumatic) transmission lines; a wheel speed sensor; control circuitry to automatically adjust the braking force in response to the signals from the wheel speed sensor; and wheel brakes.

In ABS systems, signals from the wheel speed sensor are sent to control circuitry which determines from these signals whether tire/road slippage is imminent (or has occurred). The control circuitry then sends an electrical signal to the booster/master cylinder/modulator, which typically causes a mechanical valve to open within the booster/master cylinder/modulator, thereby reducing pressure in the mechanical (hydraulic or pneumatic) transmission lines. The reduction of pressure in the transmission lines causes each of the wheel brakes connected thereto to release from engagement with the respective wheels.

One method by which a wheel slip condition is identified in an ABS system is by comparing the speed of each wheel (as measured by the wheel speed sensor) to a reference speed (either a standard value or a measured value). The reference speed is an estimate of the true vehicle speed based on current and previous measured values of the individual wheel speeds. If the speed of a wheel is significantly less than the reference speed, then the wheel is deemed by the control circuitry to be excessively slipping. The control circuitry then reduces the pressure at the master cylinder/booster/modulator actuating the brake in order to reduce brake torque. The reduction of brake torque causes a reduction of the braking force, which then causes a reduction of the slip in the wheel. After a period of constant braking pressure following the pressure reduction, the pressure actuating the brake is increased until wheel slip occurs again. The cycle of decreasing the brake pressure, maintaining constant brake pressure, and then increasing brake pressure is repeated until excessive slip no longer occurs.

In other ABS systems, determination of the slip condition is based on the sensed peripheral speed of the wheel, and the computed acceleration or deceleration of the wheel. Acceleration and deceleration (with a negative value) are derivatives of the velocity of the wheel that are computed by the control circuitry. Based on the changing curve of the peripheral speed of the wheel, a velocity the vehicle body is also obtained (computed). From the velocity of the vehicle body and the peripheral velocity of the wheel the slip ratio is calculated. From the wheel acceleration (or deceleration) and the slip ratio, the control circuitry determines whether the state of the vehicle corresponds to a condition of excessive slipping (or in a state of slip recovery). In other words, when the wheel slip ratio exceeds a certain fixed (previously computed) value or when wheel acceleration (wheel speed) decreases beyond a certain fixed value, the control circuitry reduces brake pressure.

The control circuitry also determines when there is a state of recovery from slippage. When the wheel slip ratio decreases beyond a certain fixed value and wheel acceleration (wheel speed) acquires a tendency to increase brake pressure is increased. Thus, when the control circuitry determines that tire/road slippage is no longer imminent, the same electrical-mechanical control circuitry causes the full pressure in the mechanical transmission lines to recover (corresponding to the amount of displacement of the foot pedal) and the brakes to re-engage. In prior ABS designs this described sensing and engagement-disengagement sequence of the wheels brakes typically takes place many times per second.

All of the problems discussed above with respect to prior automobile braking systems also apply to prior ABS designs.

Another problem with prior ABS designs is that, due to the time delay between electrical signal input from the controller to the booster/master cylinder/modulator and the actual engagement or disengagement of the wheel brake from the wheel, the efficiency and precision of the ABS system (and therefore the degree of control afforded the vehicle's driver) are each inherently limited.

Another problem with prior ABS designs is that because the controller-generated electrical signal causes mechanical transmission line pressure changes which affect at least two (and in most cases four) wheels, it is not usually possible or practical to individually and independently control the braking at each wheel.

SUMMARY OF THE INVENTION

Accordingly, it is a primary object of the present invention to provide a braking system, adapted for use on automotive wheels and similar applications, in which brake pad motion is effected by electrical actuators positioned in close proximity to each individual wheel.

It is another object of the present invention to provide a braking system of the character described in which the electrical actuators comprise piezoelectric elements.

It is another object of the present invention to provide a braking system of the character described in which the pressure applied by the brake pad to the wheel varies in accordance with voltage, frequency, and/or current applied to the piezoelectric element(s).

It is another object of the present invention to provide a braking system of the character described in which the electric signal to the piezoelectric element(s) varies in accordance with brake pedal displacement.

It is another object of the present invention to provide a braking system of the character described in which brake pad motion is responsive to a signal communicated to the piezoelectric element by electric transmission lines, and which is therefore, relatively less expensive, heavy, cumbersome and space consuming than mechanical transmission lines, is not subject to frictional wear, and is not subject to leaking hydraulic fluid or air.

It is another object of the present invention to provide a braking system of the character described which is provided with an anti-lock braking sensor and controller, wherein the piezoelectric element is in electrical communication with the controller, such that deformation of the piezoelectric element (and therefore the amount of pressure applied by the brake pad) is controllable by electric input to the piezoelectric element by the controller.

It is another object of the present invention to provide a braking system of the character described in which there is little or no time delay between electrical signal generation by the controller and actual engagement or disengagement of the brake pad with the wheel.

It is another object of the present invention to provide a braking system of the character described in which the anti-locking of individual wheels of a multi-wheel automobile is independently controlled at each wheel.

Further objects and advantages of my invention will become apparent from a consideration of the drawings and ensuing description thereof.

DESCRIPTION OF THE PREFERRED EMBODIMENT

Figure 1:
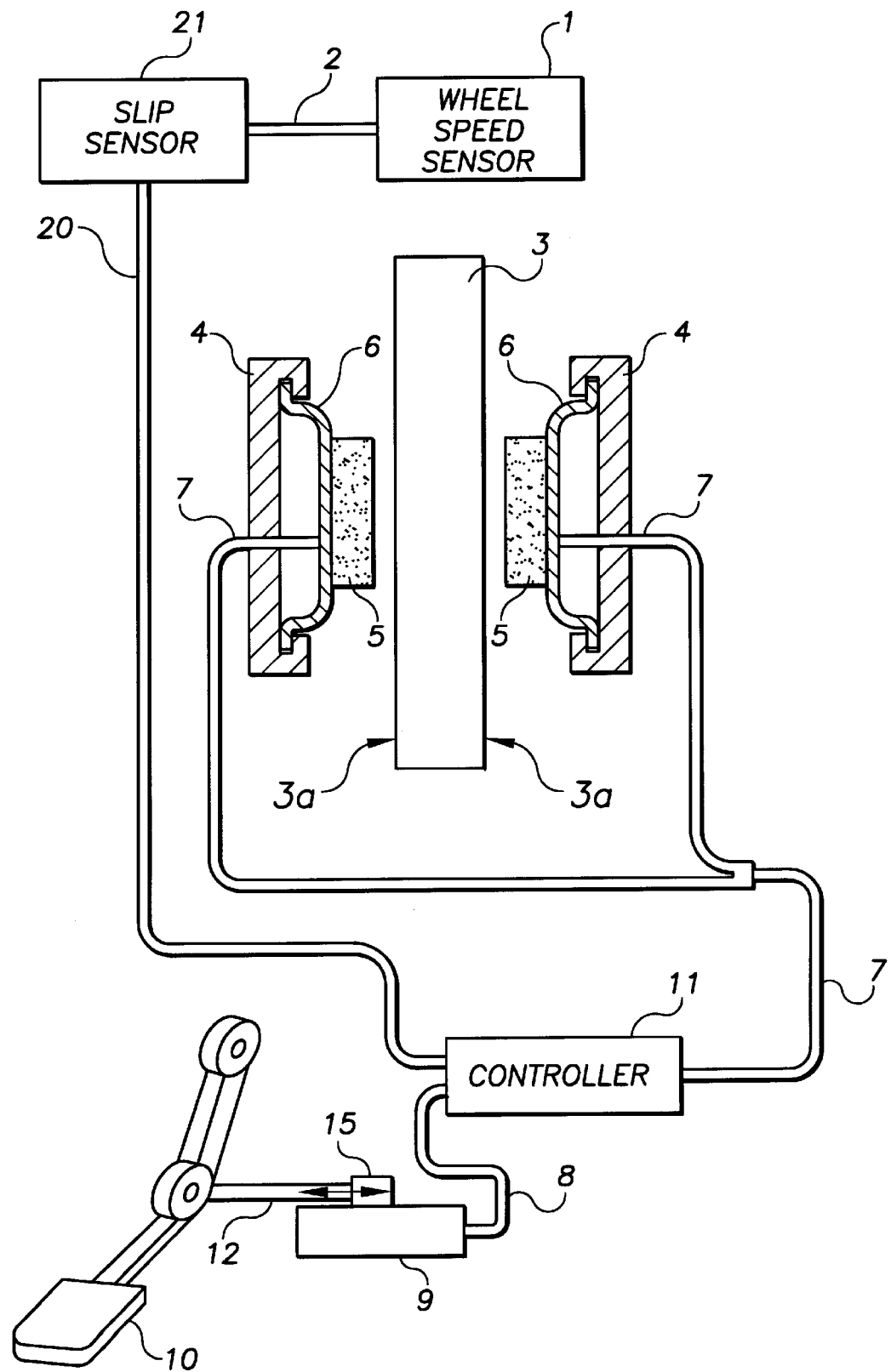
FIG. 1 is a schematic view showing a brake system constructed in accordance with the present invention.

As illustrated in the accompanying figures, an anti-lock braking system has a foot pedal 10 which is connected via a mechanical link 12 to an electric signal generator 9. The electric signal generator 9 is in communication with an electric controller 11 via electric conductor 8. The electric signal generator 9 produces a variable electric signal output (at conductor 8) corresponding to the positioning of a slider mechanism 15 (or the equivalent) associated with the foot pedal 10 and the controller 11. Based upon the electric signal output (conductor 8) of the electric signal generator 9, the controller 11 produces a corresponding electric signal which it communicates to piezoelectric actuators 6 via electric conductors 7.

Figure 3:
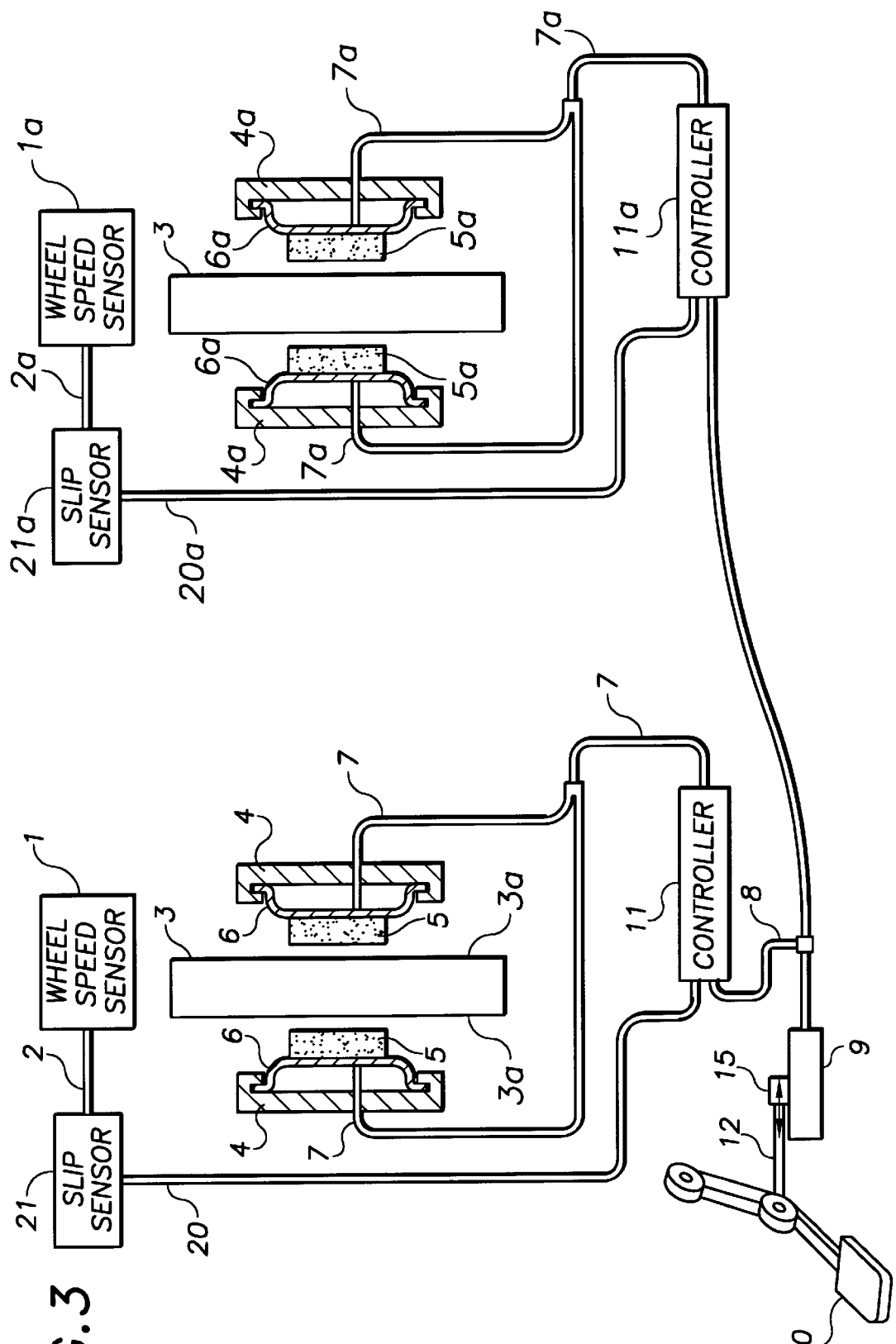
FIG. 3 is a schematic view of a brake system constructed in accordance with the present invention, showing independent antilock wheel control for two wheels.
Figure 4:
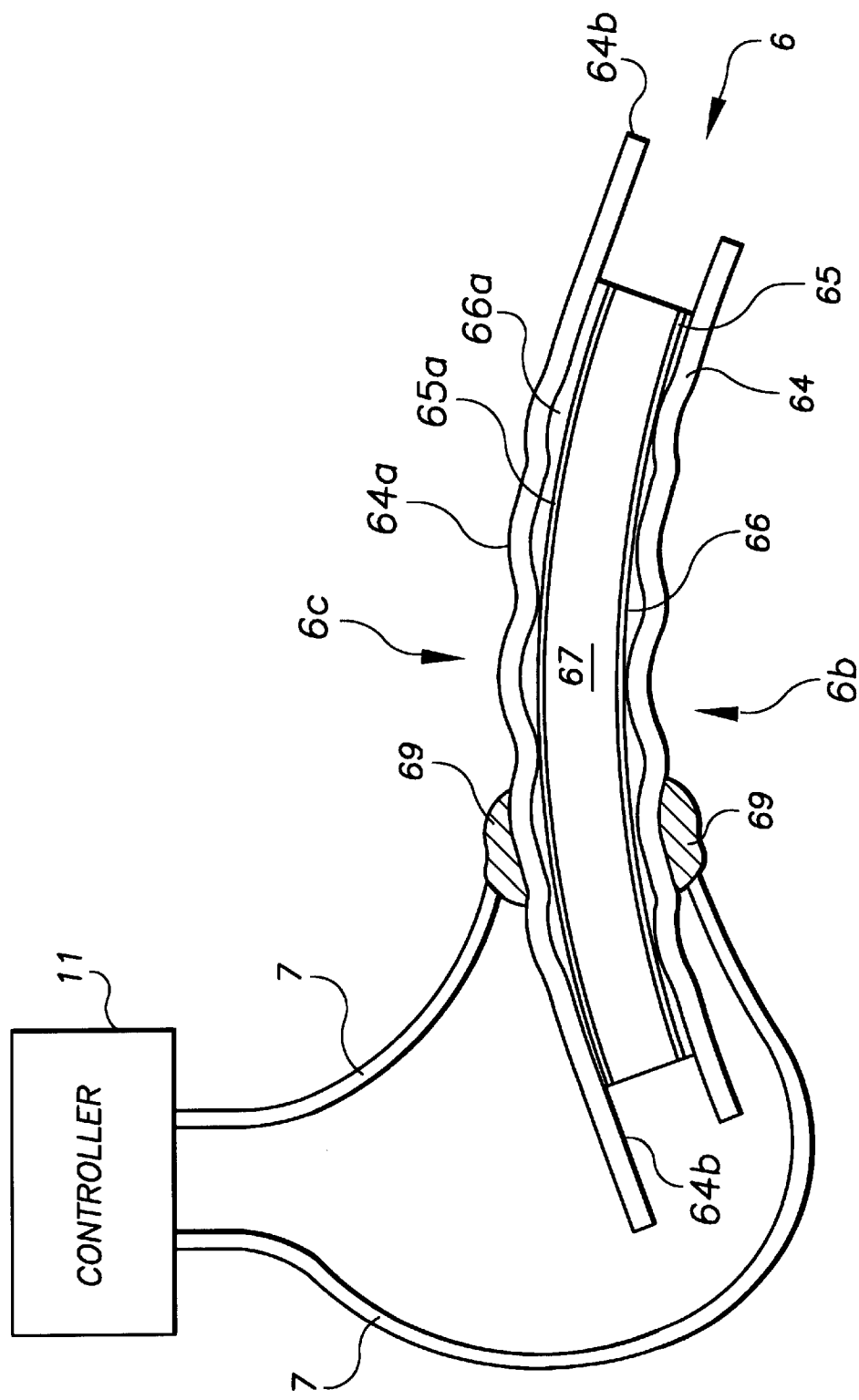
FIG. 4 is an elevation of a piezoelectric actuator and friction braking means of the present invention.

Referring to FIG. 4: The piezoelectric actuators 6 preferably comprise unimorph piezoelectric elements. The unimorph piezoelectric elements comprise a piezoelectric ceramic layer having opposing major faces. On one major face of the piezoelectric ceramic layer is bonded a pre-stress layer. The pre-stress layer normally applies a compressive force to the piezoelectric ceramic layer in a longitudinal direction parallel to the major faces of the piezoelectric ceramic layer. A piezoelectric actuator 6 thus constructed has a normally arcuate shape as illustrated in FIGS. 1–4. The piezoelectric actuator 6 is a flextensional piezoelectric transducer. Various constructions of flextensional piezoelectric actuators 6 may be used (including, for example, "moonies", "rainbows", and other unimorph, bimorph, multimorph or monomorph devices, as disclosed in U.S. Pat. No. 5,471,721), but the piezoelectric actuator 6 preferably comprises a Thin Layer Unimorph Driver and Sensor ("THUNDER™") actuator constructed in accordance with the following description.

THUNDER™ piezoelectric actuators 6 are composite structures as illustrated in FIG. 4. Each THUNDER™ piezoelectric actuator 6 is preferably constructed with a PZT piezoelectric ceramic layer 67 which is electroplated 65 and 65a on its two opposing faces. A steel, stainless steel, beryllium alloy or other metal first pre-stress layer 64 is adhered to the electroplated 65 surface on one side of the ceramic layer 67 by a first adhesive layer 66. The first adhesive layer 66 is preferably LaRC™-SI material, as developed by NASA-Langley Research Center and commercially marketed by IMITEC, Inc. of Schenectady, N.Y. A second adhesive layer 66a, also preferably comprising LaRC™-SI material, is adhered to the opposite side of the ceramic layer 67.

During manufacture of the THUNDER™ piezoelectric actuator 6 the ceramic layer 67, the adhesive layers 66 and 66a and the first pre-stress layer 64 are simultaneously heated to a temperature above the melting point of the adhesive material, and then subsequently allowed to cool, thereby re-solidifying and setting the adhesive layers 66 and 66a. During the cooling process the ceramic layer 67 becomes compressively stressed, due to the higher coefficient of thermal contraction of the material of the pre-stress layer 64 than for the material of the ceramic layer 67.

Also, due to the greater thermal contraction of the laminate materials (e.g. the first pre-stress layer 64 and the first adhesive layer 66) on one side of the ceramic layer 67 relative to the thermal contraction of the laminate material(s) (e.g. the second adhesive layer 66a) on the other side of the ceramic layer 67, the ceramic layer deforms in an arcuate shape having a normally concave face 6b and a normally convex face 6c, as illustrated in FIG. 4. One or more additional pre-stressing layer(s) 64a may be similarly adhered to either or both sides of the ceramic layer 67 in order, for example, to increase the stress in the ceramic layer 67 or to strengthen the piezoelectric actuator 6.

Electrical energy is introduced to the piezoelectric actuator by a conductors 7 attached to opposite sides of the piezoelectric actuator 6 in communication with the electroplated 65 and 65a faces of the ceramic layer 67. As discussed above, the pre-stress layers 64 and 64a are preferably adhered to the ceramic layer 67 by LaRC™-SI material. The wires 7 may be connected (for example by glue or solder 69) directly to the electroplated 65 and 65a faces of the ceramic layer 67, or they may alternatively be connected to the pre-stress layers 64 and 64a. LaRC™-SI is a dielectric. When the conductors 7 are connected to the pre-stress layers 64 and 64a, it is desirable to roughen a face of each pre-stress layer 64 and 64a, so that the pre-stress layers 64 and 64a intermittently penetrate the respective adhesive layers 66 and 66a, and make electrical contact with the respective electroplated 65 and 65a faces of the ceramic layer 67.

Figure 2:
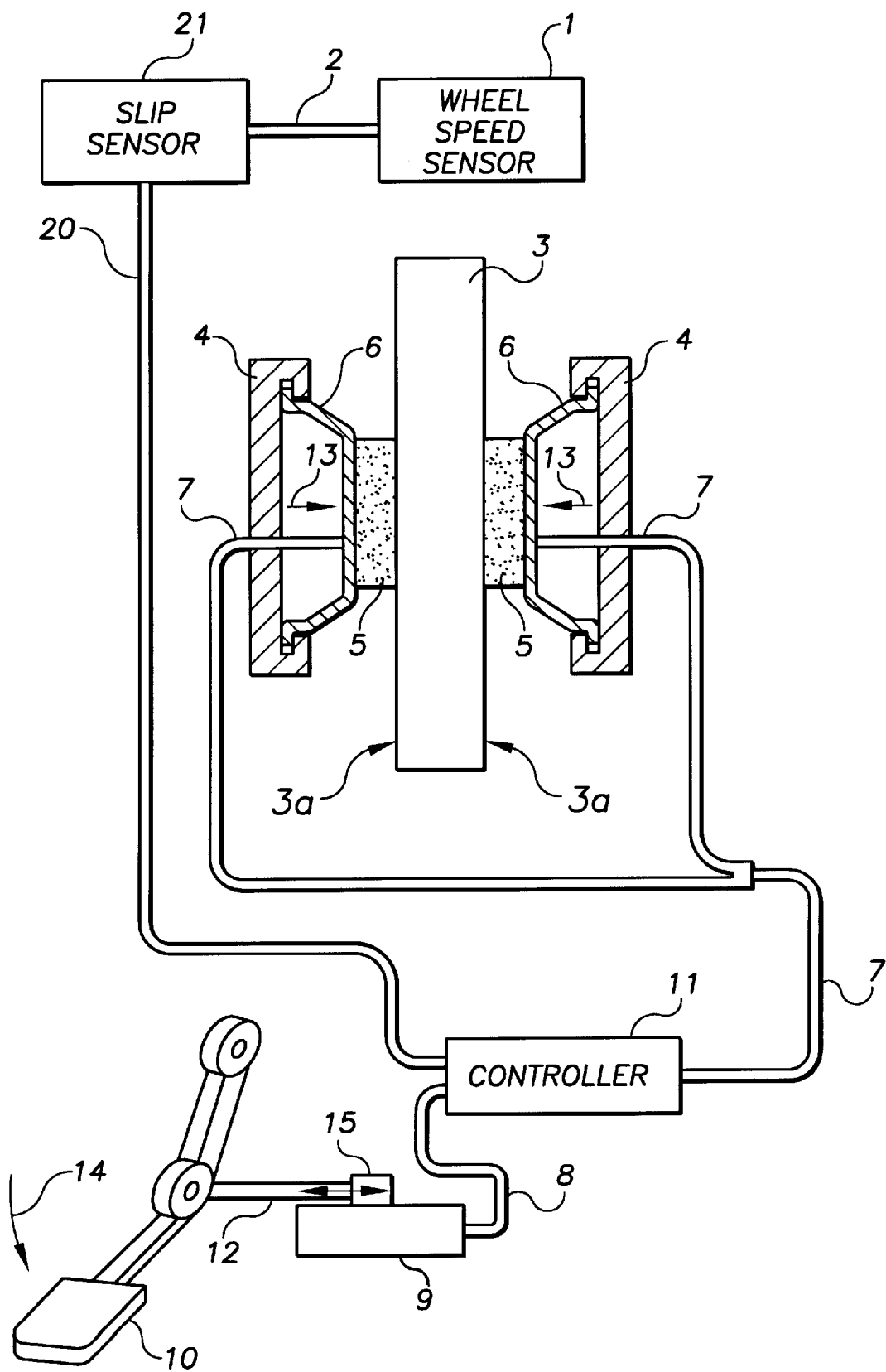
FIG. 2 is a schematic view of a brake system similar to FIG. 1, showing the brake pad in the actuated position.

When the piezoelectric actuator 6 is energized by an electric field (via electric conductors 7), it principally deforms in one direction (in the direction of arrows 13) in a direction perpendicular to its major faces 6b and 6c (becoming more arcuate) as illustrated in FIGS. 2 and 3. When the electric field is decreased or removed, the piezoelectric actuator relaxes, becoming less arcuate or returning to its normal arcuate shape, as shown in FIG. 1.

In the preferred embodiment of the invention, two piezoelectric actuators 6 are each mounted on a rigid frame 4 and are aligned along a common axis on opposite sides of a moveable brake disc 3. Preferably, the axis of deformation of the piezoelectric actuator 6 is perpendicular to the planar surfaces 3a of the brake disc 3. Brake pads 5 are preferably mounted on the faces 6c of the piezoelectric actuators 6 that face the brake disc faces 3a.

Under normal braking operations, when the foot pedal 10 is depressed (as indicated at arrow 14) the mechanical link 12 displaces the slider mechanism 15, which causes the electric signal generator 9 to produce an electric output signal. This electrical output signal is transmitted to the controller 11 via conductor 8. The controller 11 produces an output electric signal, the character of which (e.g. voltage, power, and/or frequency, etc.) depends upon the amount of foot pedal 10 displacement, and communicates that (or a corresponding) electric signal to the piezoelectric actuators 6 via electric conductors 7. Depending upon the character (e.g. voltage, power, frequency, etc.) of the electric signal which is received by the piezoelectric actuator 6 (via conductor 7) from the controller 11, the piezoelectric element will axially deform as indicated by arrows 13 so as to press brake pads 5 against the brake disc 3, thereby applying a braking force to the (rotatable) brake disc 3.

When the (spring loaded) foot pedal 10 is released, the electric signal produced by the electric signal generator 9 changes, which causes the electric signal output from the controller 11 to cease (or diminish), which causes the piezoelectric actuators 6 to relax, thus relieving brake pad 5 pressure against the brake disc 3.

As shown in the figures, the braking system may be provided with anti-locking (or "anti-skidding") control elements. In addition to receiving electric signal input (via conductor 8) from the electric signal generator 9 (indicative of the positioning of the brake pedal 10), the controller 11 may also be in communication (via electric conductor 20) with a slip sensor 21. The slip sensor 21 receives electrical signals (via electric conductor 2) from the wheel speed sensor 1. The wheel speed sensor 1 sends an electric signal (via conductor 2) to the slip sensor 21 corresponding to the sensed rotational (peripheral) speed of the wheel. From the sensed peripheral wheel speed, the slip sensor 21 computes acceleration and deceleration, as well as the vehicle body speed. The slip sensor 21 also compares the sensed peripheral wheel speed to the computed vehicle body speed and acceleration (deceleration) to determine if a slip condition is imminent (or exists).

When the slip sensor 21 receives electric signals from the wheel speed sensor 1 (via conductor 2) the slip sensor 21 records the peripheral wheel speed and computes the vehicle body speed and/or wheel acceleration. Based upon a comparison of recorded and computed values, the slip sensor 21 determines whether the values are indicative of incipient wheel slippage. If the slip sensor 21 determines that wheel-road slippage is imminent (or exists), the slip sensor 21 sends an electric signal (via conductor 20) to the controller 11. In response to the electric signal from the slip sensor 21, the controller 11 varies (i.e. reduces) the electric signal which it sends (via conductor 7) to the piezoelectric actuators 6. The reduced electric signal, in turn, causes the piezoelectric elements to relax, thereby reducing (or releasing) pressure of the brake pads 5 against the brake disc 3 and allowing the brake disc 5 and the wheel (not shown) to freely rotate without wheel-road slippage.

When the wheel begins freely rotating, the wheel speed sensor 1 again sends electric signals to the slip sensor 21 which records the peripheral wheel speed and computes the values for acceleration and vehicle body speed. Based on a comparison of these values, the slip sensor 21 may determine that wheel-road slippage is no longer imminent, and the slip sensor 21 will send an electric signal to the controller 11 indicative of there being no slip condition. In response to the electric signal from the slip sensor 21, the controller 11 adjusts the electric signal it sends to the piezoelectric actuators 6 (via electric conductor 7) accordingly. The piezoelectric actuators 6 will again deform and apply braking pressure in accordance with the positioning of the foot pedal 10. If, however, the slip sensor 21 again senses incipient wheel-road slippage, it will again cause the controller 11 to vary its signal (via conductor 20), again causing the brake pads 5 to disengage (temporarily) from the brake disc 3.

It will be understood that in an anti-locking braking system constructed in accordance with the present invention the described engagement-disengagement cycling of the brake pads 5 and the brake disc 3 can occur many times per second. It will further be understood that brake pad application or release is accomplished by the controlled deformation of the piezoelectric actuators 6, which are directly responsive to electric signals corresponding to foot pedal positioning, measured wheel speed and values computed by the slip sensor 21 on the basis of wheel speed which indicate a slip condition. Accordingly, it will be understood that there is virtually no time delay between foot pedal displacement and brake pad displacement, or between incipient wheel-road slippage detection and brake pad displacement.

It will also be understood that an anti-lock braking system constructed in accordance with the present invention does not require the use of either hydraulic or pneumatic transmission lines, and therefore is not susceptible to hydraulic fluid or air leaks.

FIG. 3 illustrates a braking system constructed in accordance with the present invention in which each of a plurality of wheels (not shown) is provided with independent anti-locking control. This modification of the invention operates the same as the embodiment described above, except the output electric signal (i.e. via conductor 8) is communicated simultaneously to two controllers 11 and 11*a*, each of which controls (via electric conductors 7 and 7*a*, respectively) the operation the piezoelectric actuators (6 and 6*a*, respectively) to which it is electrically connected. It will be understood that in a multiple-wheel braking system constructed in accordance with this modification of the invention, each wheel is provided with independent anti-lock control (i.e., wheel speed sensors 1 and 1*a*, slip sensors 21 and 21*a* and controllers 11 and 11*a*) while being responsive to a single brake foot pedal input.

The foregoing describes the application of the present invention in automobiles. However, the present invention has application to many fields other than to automobile wheel braking in particular and to automobiles generally. It will be understood that a braking system constructed in accordance with the foregoing disclosure may be used to in conjunction with any form of moving machinery, regardless of whether the moving element to be braked moves linearly, angularly or otherwise relative to the braking element (e.g. the brake pad 5). In addition, the foregoing describes an embodiment of the invention wherein piezoelectric braking elements are configured to operate in opposing fashion against a rotatable brake disc 3. However, it is also understood that the present invention, (particularly the piezoelectric actuators 6 and the brake pads 5) can alternatively be configured to operate against the inside of a rotatable brake drum.

While the above description contains many specificities, these should not be construed as limitations on the scope of the invention, but rather as an exemplification of one preferred embodiment thereof. Many other variations are possible, for example:

A piezoelectrically actuated braking system may be constructed in a modification of the present invention without anti-locking controls by omitting the wheel speed sensor, slip sensor and/or the controller;

The piezoelectric elements (i.e. the actuators) may be in the shape of toroids, and the shaft (axle) of the braked wheel may pass through a central hole in the piezoelectric element;

The brake pad member 5 may be omitted such that the piezoelectric element 6 applies pressure directly to a brake disc 3, a brake drum, or an equivalent moving component;

The piezoelectric actuator 6 may apply pressure directly to a brake pad 5, brake "shoe" or the equivalent, or it may apply pressure to a force multiplying mechanism (eg. piston, lever, etc.) which, in turn, applies pressure to a brake pad 5, brake "shoe" or the equivalent;

The piezoelectric actuator 6 may comprise multiple piezoelectric elements working in concert;

Inasmuch as the disclosed braking system can be used in applications other than automotive, the originating braking signal may be produced by an operator other than by a foot pedal 10, including both mechanical and electrical, and digital and analog, switching devices;

A modified embodiment of the present invention may be constructed in which the electric signal generator 9 and the electric conductor 8 are replaced by a mechanical (rather than electrical) energy transmission system, such that an input (8) to the controller 11 is mechanical in nature rather than electrical;

The piezoelectric actuator may be biased such that braking pressure is applied only when the piezoelectric element is electrically excited; or, alternatively, it may be biased such that braking pressure is normally applied, and releases only when the piezoelectric element is electrically excited.

The multiple-controller 11 and 11*a* arrangement shown in FIG. 3 may be replaced with a single controller having multiple inputs and outputs;

The output signal 7 from a single controller 11 may be transmitted to one or more piezoelectric actuators 6 which may brake one or more brake discs, brake drums, or their equivalents;

The electric signal generator 9 may be a piezoelectric device which generates variable electric signal outputs 8 corresponding the displacement of pressure applied to the foot pedal 10 (or equivalent device).

I claim:

1. An electrical braking system, comprising:
    first friction braking means comprising;
        a first piezoelectric ceramic layer having opposing first and second major faces; and
        a first prestress layer bonded to said first major face of said piezoelectric ceramic layer;
        wherein said first prestress layer normally applies a compressive force to said first piezoelectric ceramic layer;
    a first moveable member to be braked;
    an electric controller for generating a first electrical output signal for operating said first friction braking means in accordance with brake force demand inputs, said electric controller having an input side and an output side;
    a first electrical conductor connected on a first end to said output side of said electric controller and on a second end across said first and second faces of said first piezoelectric ceramic layer of said first friction braking means;
    actuating means for generating a first brake force demand input signal for said controlling means, said actuating means comprising;
        a mechanical input device for generating a variable mechanical signal;
        an electrical signal generator for generating a first brake force demand input signal proportional to said variable mechanical signal;
        said electrical signal generator being in mechanical communication with said mechanical input device and in electrical communication with said input side of said electric controller;
    a first wheel slip sensing means for determining a first wheel-road slippage condition, said first wheel slip sensing means comprising:
        a first wheel speed sensor for sensing a peripheral wheel speed;
        said first wheel speed sensor having an output signal proportional to said peripheral wheel speed;
        first slip computing means for computing an acceleration and a vehicle body speed;
        said first slip computing means comparing said sensed peripheral wheel speed to said computed acceleration and said computed vehicle body speed to determine if said first wheel-road slippage condition exists; and
        first signal generation means for generating a second brake force demand input signal indicative of said first wheel-road slippage condition;
        said first signal generation means being in electrical communication with said input side of said electric controller;

whereby electrically energizing said first friction braking means moves said friction braking means into contact with said first moveable member;

and whereby a first braking force is generated by moving said first friction braking means into contact with said first moveable member.

2. The apparatus according to claim 1, wherein said electric controller further comprises:

de-energizing means for electrically de-energizing said first friction braking means in response to said second brake force input signal indicative of said first wheel road slippage condition;

whereby electrically de-energizing said first friction braking means moves said first friction braking means out of contact with said first moveable member.

3. The apparatus according to claim 2, wherein said first moveable member to be braked comprises a rotating disk having a first braking surface.

4. The apparatus according to claim 3, wherein said first friction braking means is adjacent said first braking surface of said rotating disk.

5. The apparatus according to claim 4, wherein said rotating disk further comprises a second braking surface in opposing relation to said first braking surface.

6. The apparatus according to claim 5, further comprising:

second friction braking means comprising;

a second piezoelectric ceramic layer having opposing first and second major faces; and a second prestress layer bonded to said first major face of said second piezoelectric ceramic layer;

wherein said second prestress layer normally applies a compressive force to said first piezoelectric ceramic layer;

said second friction braking means being adjacent said second braking surface of said rotating disk;

and a second electrical conductor connected on a first end to said output side of said electric controller and on a second end across said first and second faces of said second piezoelectric ceramic layer of said second friction breaking means, said electric controller being adapted to generate a second electrical output signal for operating said third friction braking means in accordance with brake force demand inputs;

whereby electrically energizing said second friction braking means moves said second friction braking means into contact with said second braking surface of said first moveable member.

7. The apparatus according to claim 6, further comprising:

third friction braking means comprising;

a third piezoelectric ceramic layer having opposing first and second major faces; and a third prestress layer bonded to said first major face of said piezoelectric ceramic layer;

wherein said third prestress layer normally applies a compressive force to said third piezoelectric ceramic layer;

a second moveable member to be braked;

a third electrical conductor connected on a first end to said output side of said electric controller and on a second end across said first and second faces of said third piezoelectric ceramic layer of said third friction braking means said electric controller being adapted to generate a third electrical output signal for operating said third friction braking means in accordance with brake force demand inputs;

a second wheel slip sensing means for determining a second wheel-road slippage condition, said second wheel slip sensing means comprising:

second wheel speed sensor for sensing a peripheral wheel speed;

said second wheel speed sensor having an output signal proportional to said peripheral wheel speed;

second slip computing means for computing an acceleration and a vehicle body speed;

said second slip computing means comparing said sensed peripheral wheel speed to said computed acceleration and said computed vehicle body speed to determine if said second wheel-road slippage condition exists; and second signal generation means for generating a third brake force demand input signal indicative of said second wheel-road slippage condition;

said second signal generation means being in electrical communication with said input side of said electric controller;

whereby electrically energizing said third friction braking means moves said third friction braking means into contact with said second moveable member;

and whereby a third braking force is generated by moving said third friction braking means into contact with said second moveable member.

* * * * *